(12) United States Patent
Sbiaa et al.

(10) Patent No.: US 7,583,482 B2
(45) Date of Patent: Sep. 1, 2009

(54) MAGNETORESISTIVE ELEMENT AND MAGNETORESISTIVE DEVICE HAVING A FREE LAYER STABILIZED BY AN IN-STACK BIAS

(75) Inventors: Rachid Sbiaa, Tokyo (JP); Isamu Sato, Tokyo (JP); Haruyuki Morita, Tokyo (JP)

(73) Assignees: TDK Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 834 days.

(21) Appl. No.: 10/998,637

(22) Filed: Nov. 30, 2004

(65) Prior Publication Data
US 2006/0114619 A1 Jun. 1, 2006

(51) Int. Cl.
*G11B 5/33* (2006.01)
(52) U.S. Cl. ................................. 360/324.12
(58) Field of Classification Search ............ None
See application file for complete search history.

(56) References Cited

U.S. PATENT DOCUMENTS

| | | | |
|---|---|---|---|
| 5,422,621 A * | 6/1995 | Gambino et al. .......... 338/32 R |
| 5,936,402 A * | 8/1999 | Schep et al. ............... 324/252 |
| 6,127,045 A * | 10/2000 | Gill .......................... 428/611 |
| 6,365,286 B1 * | 4/2002 | Inomata et al. .......... 428/811.1 |
| 6,560,077 B2 * | 5/2003 | Fujiwara et al. .......... 360/324.1 |
| 6,714,390 B2 * | 3/2004 | Terada et al. ............ 360/324.12 |
| 6,717,777 B2 * | 4/2004 | Den et al. ................. 360/324 |
| 6,847,509 B2 * | 1/2005 | Yoshikawa et al. ...... 360/324.12 |
| 6,937,447 B2 * | 8/2005 | Okuno et al. ............. 360/324.1 |
| 7,068,479 B2 * | 6/2006 | Sato et al. ............... 360/324.12 |
| 7,167,347 B2 * | 1/2007 | Sato et al. ............... 360/324.1 |
| 7,180,714 B2 * | 2/2007 | Gill .......................... 360/324.1 |
| 7,184,247 B2 * | 2/2007 | Sato et al. ............... 360/324.1 |
| 7,206,174 B2 * | 4/2007 | Sbiaa et al. .............. 360/324.1 |
| 7,236,335 B2 * | 6/2007 | Sbiaa et al. .............. 360/324.1 |

(Continued)

FOREIGN PATENT DOCUMENTS

JP  10-229013 A  8/1998

OTHER PUBLICATIONS

Susan Z. Hua, et al., "100,000% ballistic magnetoresistance in stable Ni nanocontacts at room temperature", Physical Review B 67, 2003, pp. 060401-1-060401-4.

(Continued)

Primary Examiner—David D Davis
(74) Attorney, Agent, or Firm—Sughrue Mion, PLLC

(57) ABSTRACT

An in-stack bias is provided for stabilizing the free layer of a ballistic magneto resistive (BMR) sensor. In-stack bias includes a decoupling layer that is a spacer between the free layer and a ferromagnetic stabilizer layer of the in-stack bias, and an anti-ferromagnetic layer positioned above the ferromagnetic layer. The spacer is a nano-contact layer having magnetic particles positioned in a non-magnetic matrix. The free layer may be single layer, composed or synthetic, and the in-stack bias may be laterally bounded by the sidewalls, or alternatively, extend above the sidewalls and spacer. Additionally, a hard bias may also be provided. The spacer of the in-stack bias results in the reduction of the exchange coupling between the free layer and ferromagnetic stabilizing layer, an improved $A\Delta R$ due to confinement of current flow through a smaller area, and increased MR due to the domain wall created within the magnetic nano-contact.

21 Claims, 9 Drawing Sheets

U.S. PATENT DOCUMENTS

| | | | | |
|---|---|---|---|---|
| 7,280,323 | B2* | 10/2007 | Sato et al. | 360/324.1 |
| 2003/0104249 | A1* | 6/2003 | Okuno et al. | 428/693 |
| 2003/0206382 | A1 | 11/2003 | Carey et al. | |
| 2004/0008454 | A1 | 1/2004 | Gill | |
| 2004/0075959 | A1 | 4/2004 | Gill | |
| 2005/0068685 | A1* | 3/2005 | Gill | 360/324.1 |
| 2005/0068687 | A1* | 3/2005 | Sbiaa et al. | 360/324.1 |
| 2005/0068688 | A1* | 3/2005 | Sbiaa et al. | 360/324.1 |
| 2005/0068689 | A1* | 3/2005 | Sato et al. | 360/324.1 |
| 2005/0068690 | A1* | 3/2005 | Sato et al. | 360/324.1 |
| 2005/0068698 | A1* | 3/2005 | Sato et al. | 360/324.12 |
| 2005/0105222 | A1* | 5/2005 | Sbiaa et al. | 360/324.1 |
| 2005/0111144 | A1* | 5/2005 | Sbiaa | 360/324.2 |
| 2005/0141147 | A1* | 6/2005 | Sbiaa et al. | 360/324.2 |
| 2007/0121253 | A1* | 5/2007 | Sato et al. | 360/313 |
| 2007/0188943 | A1* | 8/2007 | Sbiaa et al. | 360/324.2 |

OTHER PUBLICATIONS

G, Tatara, et al., "Domain Wall Scattering Explains 300% Ballistic Magnetoconductance of Nanocontacts", Physical Review Letters, Sep. 6, 1999, pp. 2030-2033, vol. 83, No. 10.

N. Garcia, et al., "Magnetoresistance in excess of 200% in Ballistic Ni Nanocontacts at Room Temperature and 100 Oe", Physical Review Letters, Apr. 5, 1999, pp. 2923-2926, vol. 82, No. 14.

* cited by examiner

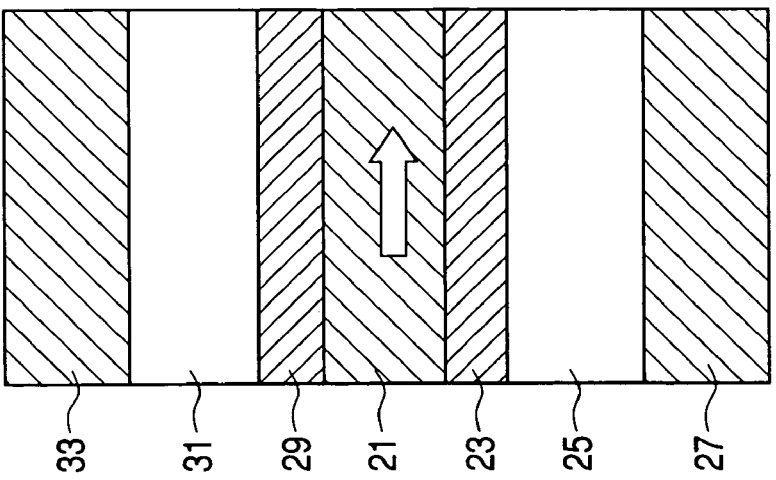
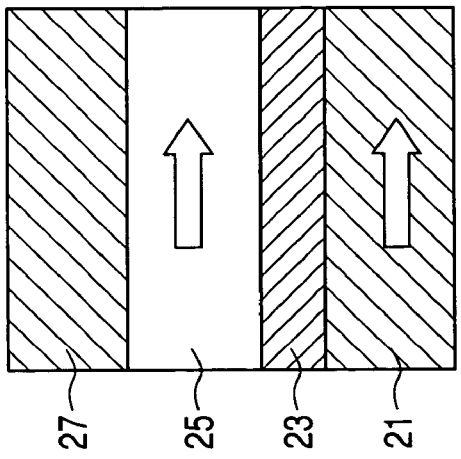
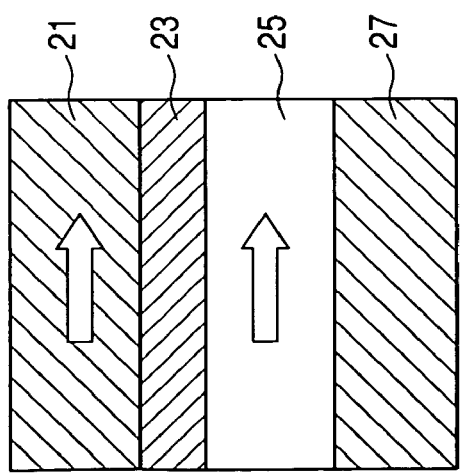

MAGNETORESISTIVE ELEMENT AND MAGNETORESISTIVE DEVICE HAVING A FREE LAYER STABILIZED BY AN IN-STACK BIAS

BACKGROUND OF THE INVENTION

1. Technical Field

The present invention relates to a magnetic head having a confined current path, and more specifically, to a ballistic magneto resistive (BMR) sensor having a free layer stabilized by an in-stack bias and spacer-decoupling layer including nanoparticles.

2. Related Art

In the related art magnetic recording technology such as hard disk drives, a head is equipped with a reader and a writer that operate independently of one another. FIGS. 1 (*a*) and (*b*) illustrate related art magnetic recording schemes. A recording medium 1 having a plurality of bits 3 and a track width 5 has a magnetization 7 parallel to the plane of the recording media. As a result, a magnetic flux is generated at the boundaries between the bits 3. This is commonly referred to as "longitudinal magnetic recording".

Information is written to the recording medium 1 by an inductive write element 9, and data is read from the recording medium 1 by a read element 11. Coils 16 are used to supply a write current 17 to the inductive write element 9, and a read current 15 is supplied to the read element 11. An insulating layer (not illustrated for the sake of clarity) made of $Al_2O_3$ or the like is deposited between the read element 11 and the write element 9 to avoid any interference between the respective read and write signals.

The read element 11 is a sensor that operates by sensing the resistance change as the sensor magnetization changes direction. A shield 13 reduces the undesirable magnetic fields coming from the media and prevents the undesired flux of adjacent bits from interfering with the one of the bits 3 that is currently being read by the read element 11.

Due to requirements of increased bit and track density readable at a higher efficiency and speed, the related art magnetic recording scheme of FIG. 1(*b*) has been developed. In this related art scheme, the direction of magnetization 19 of the recording medium 1 is perpendicular to the plane of the recording medium 1. This is also known as "perpendicular magnetic recording". This design provides more compact and stable recorded data. Also a soft underlayer (not illustrated) is required to increase the writer magnetic field efficiency. Further, an intermediate layer (not illustrated for the sake of clarity) can be used to control the exchange coupling between the recording layer 1 and soft underlayer.

FIGS. 2(*a*)-(*c*) illustrate various related art read heads for the above-described magnetic recording scheme, known as "spin valves". In the bottom type spin valve illustrated in FIG. 2(*a*), a free layer 21 operates as a read sensor to read the recorded data from the recording medium 1. A spacer 23 is positioned between the free layer 21 and a composed pinned layer 25. On the other side of the composed pinned layer 25, there is an anti-ferromagnetic (AFM) layer 27. In the top type spin valve illustrated in FIG. 2(*b*), the position of the layers is reversed.

FIG. 2(*c*) illustrates a related art dual type spin valve. Layers 21 through 25 are substantially the same as described above with respect to FIGS. 2(*a*)-(*b*). However, an additional spacer 29 is provided on the other side of the free layer 21, upon which a second pinned layer 31 and a second AFM layer 33 are positioned. An extra signal provided by the second pinned layer 31 increases the resistance change ΔR.

The direction of magnetization in the pinned layer 25 is substantially fixed, whereas the direction of magnetization in the free layer 21 can be changed, for example (but not by of limitation) depending on the effect of an external magnetic field, such as the recording medium 1.

When the external magnetic field is applied to a reader, the magnetization of the free layer 21 is altered, or rotated, by an angle. When the flux is positive the magnetization direction of the free layer 21 is rotated upward, and when the flux is negative the magnetization direction of the free layer 21 is rotated downward. If the applied external field changes the free layer 21 magnetization direction to be aligned in the same way as composed pinned layer 25, then the resistance between the layers is low, and electrons can more easily migrate between those layers 21, 25.

However, when the free layer 21 has a magnetization direction opposite to that of the composed pinned layer 25, the resistance between the layers is high. This high resistance occurs because it is more difficult for electrons to migrate between the layers 21, 25. Similar to the external field, the AFM layer 27 provides an exchange coupling and keeps the magnetization of composed pinned layer 25 substantially fixed.

The resistance change ΔR when the layers 21, 25 are parallel and anti-parallel should be high to have a highly sensitive reader. The media bit is decreasing in size, and the correspondingly, the magnetic field from the media bit is weaker. As a result, it is necessary for the free layer to sense this media flux having a reduced magnitude. Therefore, it is important for the related art free layer to have a reduced thickness to maintain sufficient sensitivity of the free layer. In order to provide a high-sensitivity sensor that can sense a very weak magnetic field, this is accomplished by reducing the free layer thickness to about 3 nm in the case of an areal recording density of 150 to 200 Gbits/in$^2$.

However, as a result of the thin free layer, there is a related art problem of a stronger spin transfer effect. The spin transfer effect is substantially inversely proportional to the thickness of the film. Thus, the stability of the free layer is reduced. Further, there is also a need for a high resistance change ΔR between the layers 21, 25 of the related art read head. As discussed in greater detail below, a thicker free layer results in a higher value of ΔR.

The operation of the related art read head is now described in greater detail. In the recording media 1, flux is generated based on polarity of adjacent bits in the case of longitudinal magnetic recording. If two adjoining bits have negative polarity at their boundary the flux will be negative. On the other hand, if both of the bits have positive polarity at the boundary the flux will be positive. The magnitude of flux determines the angle of magnetization between the free layer and the pinned layer.

FIG. 3 illustrates a related art synthetic spin valve. The free layer 21, the spacer 23 and the AFM layer 27 are substantially the same as described above. However, the composed pinned layer 25 further includes a first pinned sublayer 35 separated from a second pinned sublayer 39 by a pinned layer spacer 37. The first pinned sublayer 35 operates according to the above-described principle with respect to the composed pinned layer 25. The second pinned sublayer 39 has an opposite spin state with respect to the first pinned sublayer 35. As a result, the total composed pinned layer magnetic moment is reduced due to anti-ferromagnetic coupling between the first pinned sublayer 35 and the second pinned sublayer 39. The synthetic read head has a composed pinned layer with a total magnetic flux close to zero, and thus greater stability and high pinning field can be achieved than with the single pinned layer structure. A buffer layer 28 is deposited below the AFM layer 27 for good spin-valve growth, and a cap 40 is provided on an upper surface of the free layer 21.

FIG. 4 illustrates the related art shielded read head. As noted above, it is important to avoid the sensing of unintended magnetic flux from adjacent bits during the reading of a given bit. A cap (protective) layer 40 is provided on an upper surface of the free layer 21 to protect the spin valve against oxidation before deposition of top shield 43, by electroplating in a separated system. Similarly, a bottom shield 45 is provided on a lower surface of the buffer layer 28.

Related art magnetic recording schemes use a current perpendicular to plane (CPP) head, where the sensing current flows perpendicular to the spin valve plane. As a result, the size of the read head can be reduced without a loss of the output read signal. Various related art spin valves that operate in the CPP scheme are illustrated in FIGS. 5(a)-(c), and are discussed in greater detail below. These spin-valves structurally differ primarily in the composition of their spacer 23. The compositions and resulting difference in operation of these effects is discussed in greater detail below.

FIG. 5(a) illustrates a related art tunneling magnetoresistive (TMR) head for the CPP scheme. In the TMR head, the spacer 23 acts as an insulator, or tunnel barrier layer. Thus, in the case of a very thin barrier that is the spacer 23, the electrons can migrate from free layer 21 to pinned layer 25 or verse versa without change of spin direction. Current related art TMR heads have an increased magnetoresistance (MR) on the order of about 30-50%.

FIG. 5(b) illustrates a related art CPP-GMR head. In this case, the spacer 23 acts as a conductor. In the related art CPP-GMR head, there is a need for a large resistance change $\Delta R$, and a moderate element resistance for having a high frequency response. A low free layer coercivity is also required so that a small media field can be detected. The pinning field should also have a high strength. Additional details of the CPP-GMR head are discussed in greater detail below.

FIG. 5(c) illustrates the related art ballistic magnetoresistance (BMR) head. In the spacer 23, which operates as an insulator, a ferromagnetic region 47 connects the pinned layer 25 to the free layer 21. The area of contact is on the order of a few nanometers. This is referred to as a nano-path or a nano-contact. As a result, there is a substantially high MR, due to electrons scattering at the domain wall created within this nanocontact. Other factors include the spin polarization of the ferromagnets, and the structure of the domain that is in nano-contact with the BMR head.

In the foregoing related art heads, the spacer 23 of the spin valve is an insulator for TMR, a conductor for GMR, and an insulator having a magnetic nano-contact for BMR. While related art TMR spacers are generally made of insulating materials such as alumina, related art GMR spacers are generally made of conductive metals, such as copper.

In the related art GMR head, resistance is minimized when the magnetization directions (or spin states) of the free layer 21 and the pinned layer 25 are parallel and is maximized when the magnetization directions are opposite As noted above, the free layer 21 has a magnetization of which the direction can be changed. Thus, the GMR system avoids perturbation of the head output signal by minimizing the undesired switching of the pinned layer magnetization.

GMR depends on the degree of spin polarization of the pinned and free layers, and the angle between their respective magnetizations. Spin polarization depends on the difference between the spin state (up or down) in each of the free and pinned layers. As the free layer 21 receives the flux from the magnetic recording media, the free layer magnetization rotates by a small angle in one direction or the other, depending on the direction of flux. The change in resistance between the pinned layer 25 and the free layer 21 is proportional to angle between the moments of the free layer 21 and the pinned layer 25, as noted above. There is a relationship between the resistance change $\Delta R$ and the output read signal.

The GMR head has various requirements. For example, but not by way of limitation, a large resistance change $\Delta R$ is required to generate a high output signal. In order to generate the large resistance change $\Delta R$, it is desirable to have thicker free layer. This relationship is shown in FIG. 6(a). A similar relationship exists between the MR ratio and free layer thickness, as shown in FIG. 6(b). Therefore, the thinner free layer, which is required to sense a smaller media bit with a weaker signal, also has a lower MR and A$\Delta R$ in the related art CPP scheme. As a result, the related art spin transfer effect problem is increased.

As noted above, further increasing capacity of disk drives requires a small, high-sensitivity MR head that corresponds to the miniaturization of the head size. As head size decreases, the head output signal decreases. Accordingly, the free layer must be more sensitive to the media magnetic field. As discussed in S. Z. Hua et al., Phys. Review B67, 060401 (R) (2003), a high resistance change $\Delta R$ can be obtained using the foregoing related BMR concept (i.e., connection of at least two ferromagnetic layers to one another via a nano-contact). A substantially high BMR value can be achieved (e.g., thousands of percent of MR ratio).

The basis of the above-described BMR is disclosed in G. Tatara et al., Phys. Review Letters, Vol. 83, 2030 (1999), based on the thin domain wall between the two adjacent ferromagnetic layers that are antiparallel to each other.

In the related art BMR head, a key factor is the magnetic domain structure. Its configuration control and stability during the read process are extremely important for high-out put signal t. Further, for proper use of the BMR head, it is necessary to stabilize the free layer against thermal agitation and spin transfer effect and make it mono-domain.

Stabilization of the free layer in the related art has been done in the case of CPP-GMR, via an in-stack bias. This configuration is disclosed in U.S. Patent Publication No. 2004/0008454. In this related art in-stack bias, a decoupling layer is formed as a spacer above the free layer. The decoupling layer is made of a continuous conductive film having a thickness of 1 nm to 2 nm. The film may be made of a metal such as Cr, Ta or Cu.

Additionally, Japanese Patent Application Publication No. 10-229013 discloses a magneto-resistive effect element with an in-stack bias. More specifically, a bias film having a structure such that it can stabilize the free layer in mono-domain magnetic structure.

SUMMARY OF THE INVENTION

It is an object of the present invention to overcome the related art problems and disadvantages. However, such an object, or any object, need not be achieved in the present invention.

To achieve the above objects, a magnetic element including a spin valve is provided for reading a recording medium, and includes a free layer having a magnetization adjustable in response to an external field, a pinned layer having a substantially fixed magnetization, a spacer sandwiched between the pinned layer and the free layer, the spacer comprising a non-magnetic insulating matrix and a magnetic grain disposed therein to form nano-contacts, and an in-stack bias positioned on the free layer opposite the spacer, wherein the in-stack bias comprises a ferromagnetic layer pinned by exchange coupling with a first antiferromagnetic (AFM) layer, and an in-stack bias spacer including a magnetic grain disposed in an insulating matrix. The foregoing may also be implemented in a device.

BRIEF DESCRIPTION OF THE DRAWINGS

FIGS. 2(a)-(c) illustrate related art bottom, top and dual type spin valves;

DETAILED DESCRIPTION OF THE INVENTION

The present invention includes an in-stack biased (also referred to as "exchange biased") magnetic head having a confined current path according to the exemplary, non-limiting embodiments described herein, and equivalents thereof as would be known by one of ordinary skill in the art.

In the present invention, the term "read head" is used interchangeably with the term "magnetic sensor", and refers to the overall apparatus for sensing data from a recording media. In this regard, "magnetic sensor" is one particular type of "magnetic element", and where magnetic sensors are used in the specification, other magnetic elements (e.g., random access memory or the like) may be substituted therein, as would be known by one of ordinary skill in the art.

Additionally, the term "magnetic element" is defined to include "magnetoresistance effect element" and/or "magnetoresistance element" as is understand by those of ordinary skill in this technical field. However, the present invention is not limited thereto, and other definitions as would be understood by those of ordinary skill in the art may be substituted therefore without narrowing the scope of the invention. Further, the term "spin valve" is used to refer to the specific structural makeup of the read head layers.

Figure 1B:
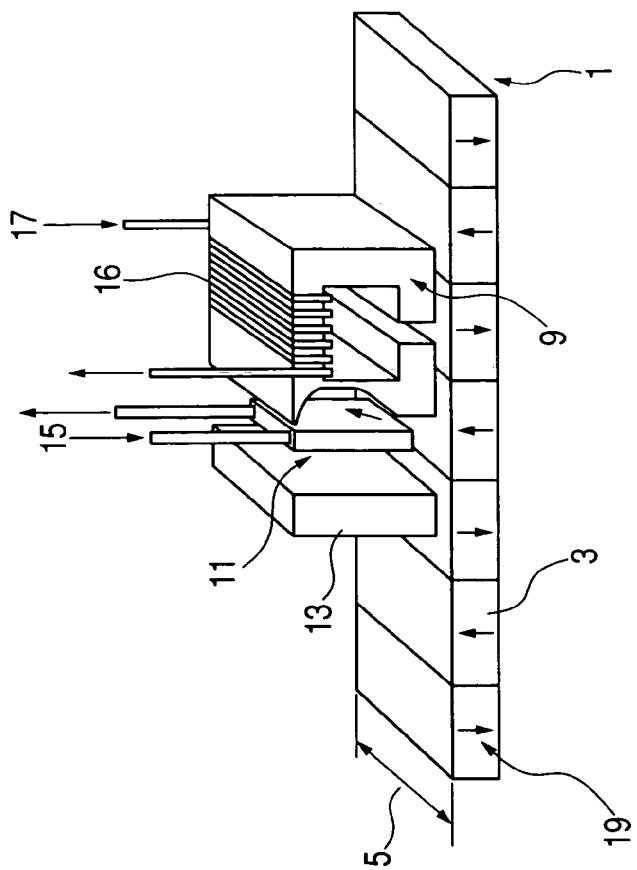
FIGS. 1(a) and (b) illustrates a related art magnetic recording scheme having in-plane and perpendicular-to-plane magnetization, respectively.
Figure 1A:
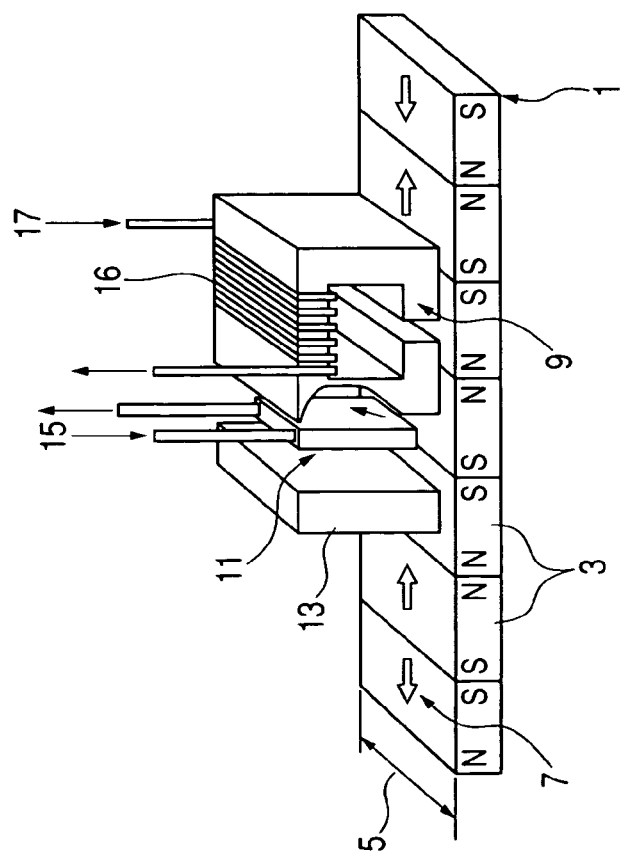
Figure 3:
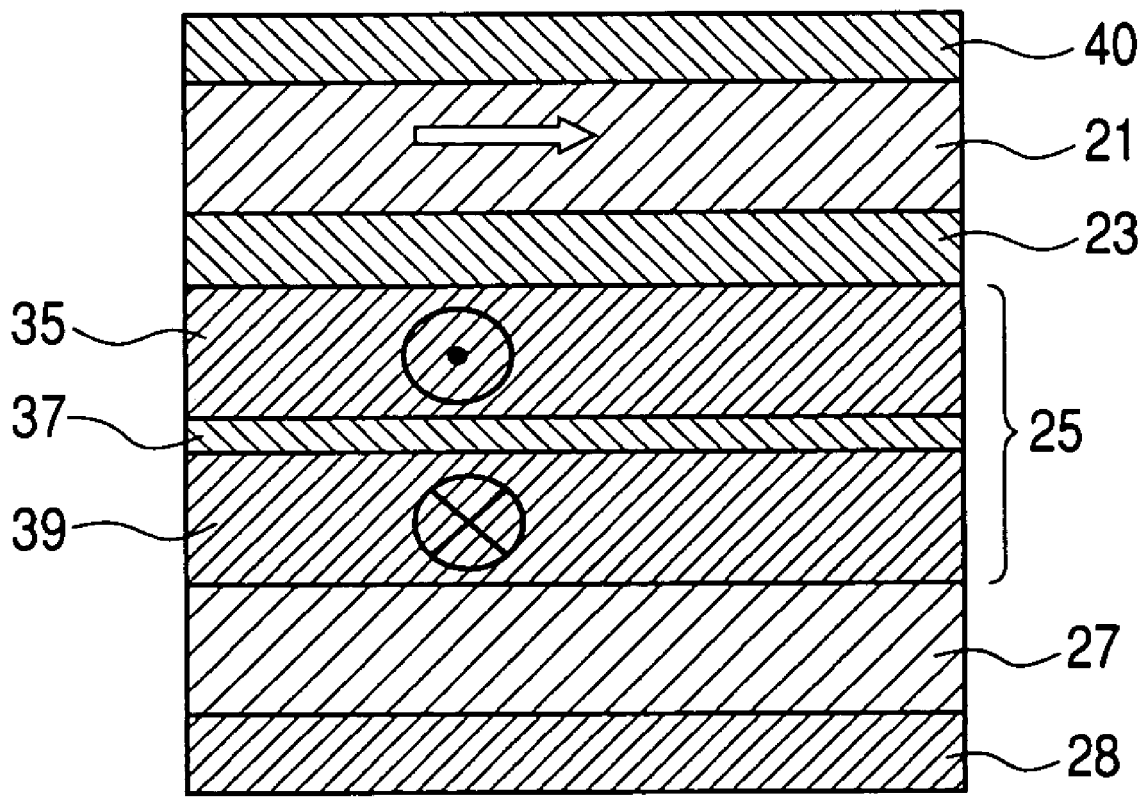
FIG. 3 illustrates a related art synthetic spin valve for a magnetoresistive reader head.
Figure 4:
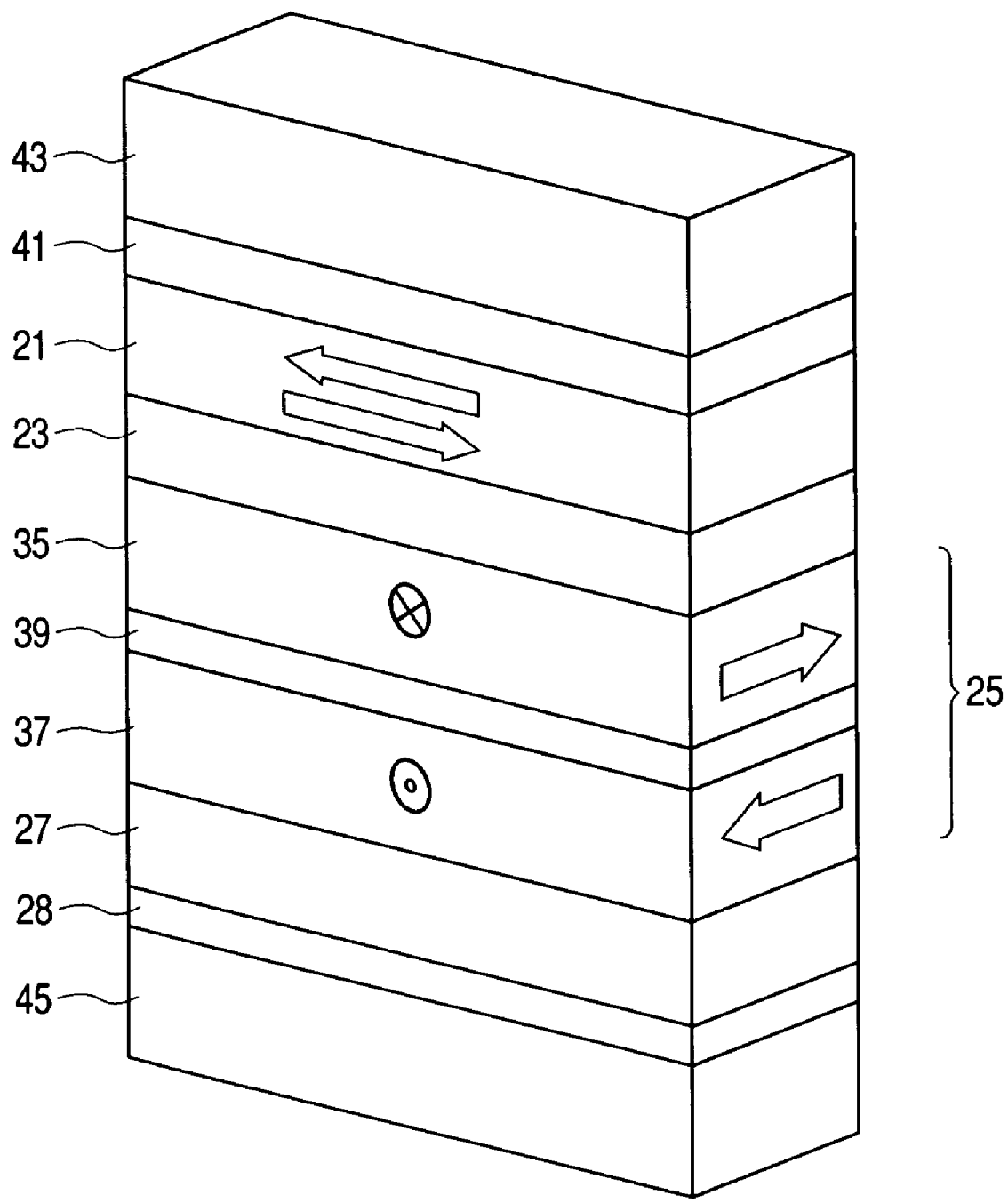
FIG. 4 illustrates a related art synthetic spin valve having a shielded structure.
Figure 5A:
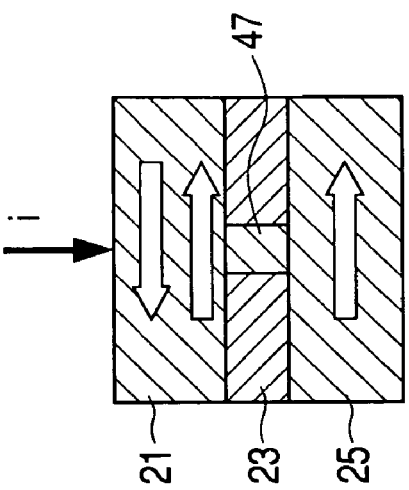
FIGS. 5(a)-(c) illustrates various related art magnetic reader spin valve systems.
Figure 5B:
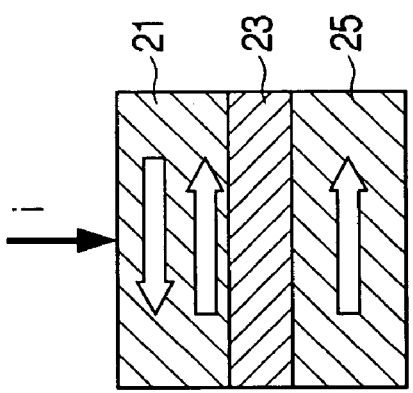
Figure 5C:
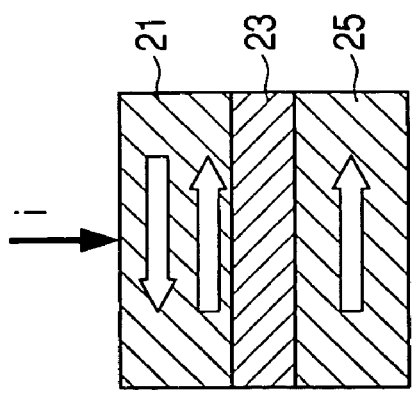
Figure 6A:
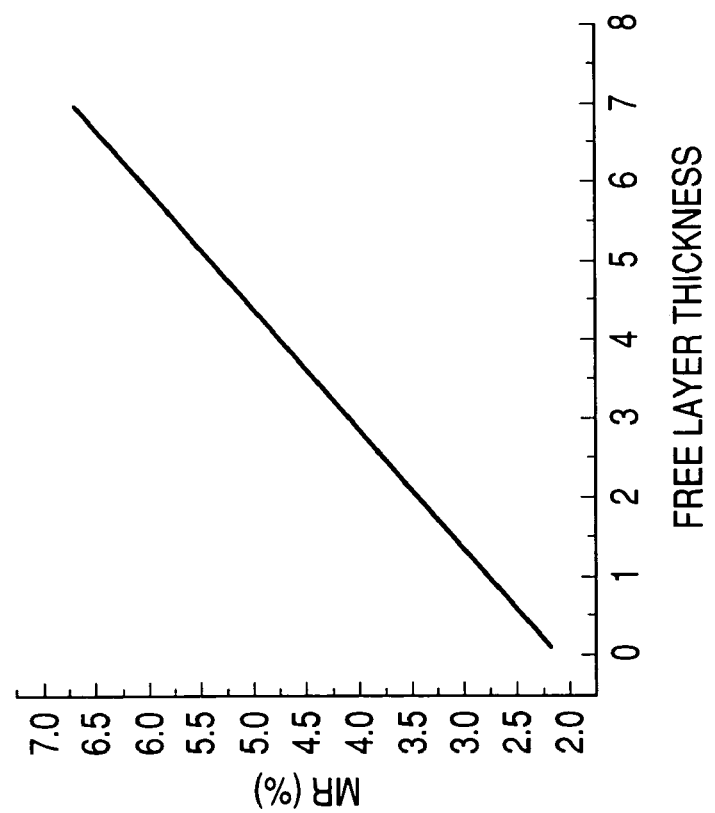
FIGS. 6(a)-(b) illustrate the dependence of AΔR and MR, respectively on free layer thickness.
Figure 6B:
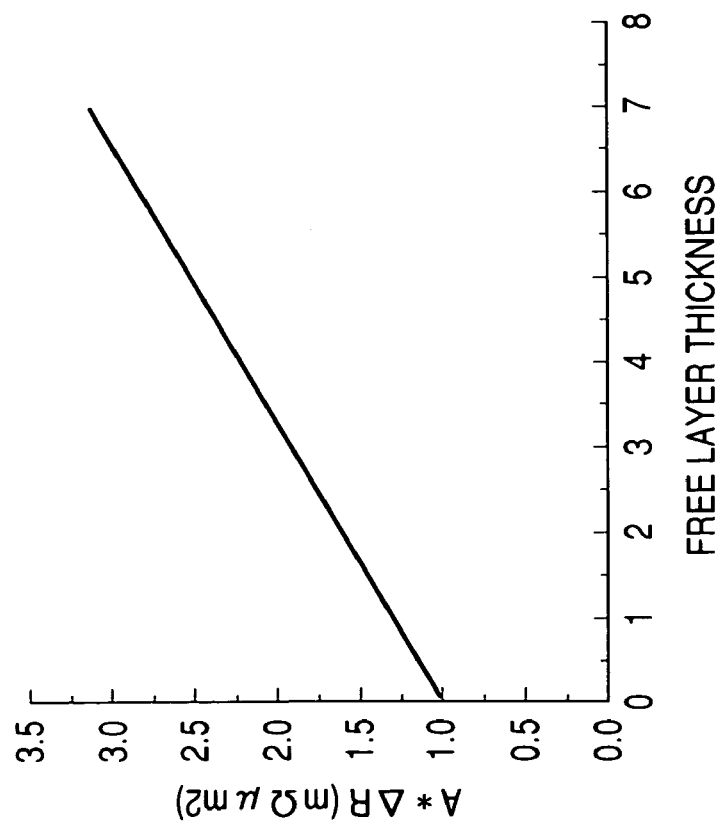
Figure 7:
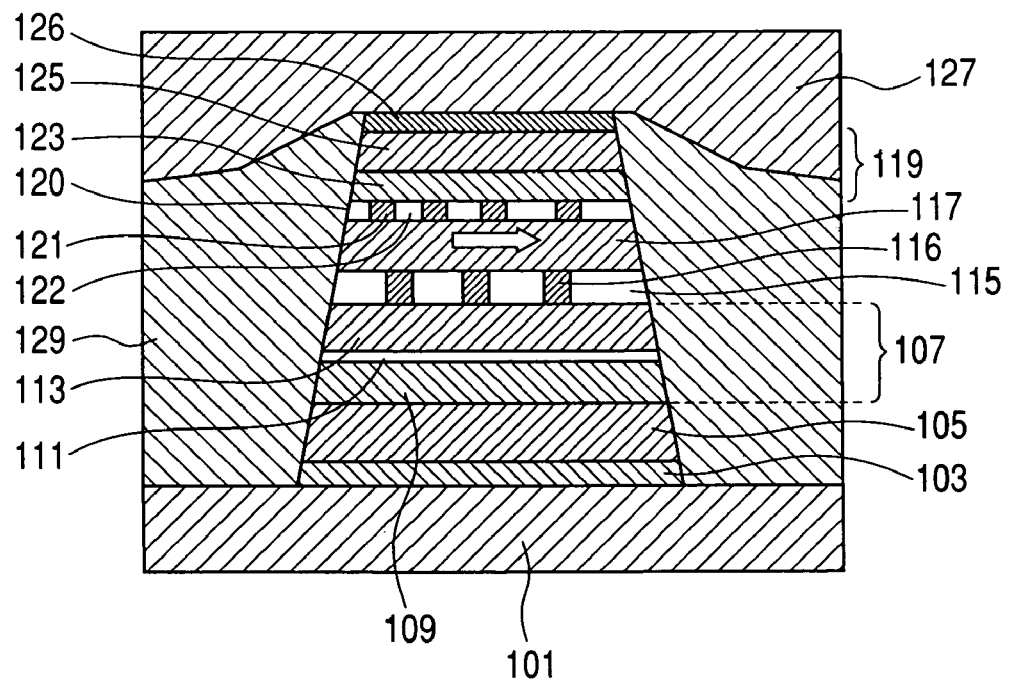
FIG. 7 illustrates magneto-resistive element according to a first exemplary, non-limiting embodiment of the present invention.

FIG. 7 illustrates a BMR sensor (also referred to as a "magnetic sensor") according to a first exemplary, non-limiting embodiment of the present invention. In this embodiment, a shield 101 is provided (preferably made of NiFe, but not limited thereto), upon which a buffer 103 is positioned.

The buffer 103 is for good growth of an AFM layer 105 and the other films that are deposited on the buffer 103.

The AFM layer 105 provides a coupling for a pinned layer 107 having a substantially fixed magnetization direction, which is positioned above the AFM layer 105. The pinned layer 107 is preferably of a composed type, although another equivalent thereof, as would be known by one of ordinary skill in the art (e.g., single layer) may also be used. The composed pinned layer 107 includes a first pinned sublayer 109 spaced apart from a second pinned sublayer 113 by a non-magnetic pinned layer spacer 111. For example, but not by way of limitation, these first and second pinned sublayers 109, 111 may be ferromagnetic.

A spacer 115 is positioned between the pinned layer 107 and a free layer 117. The spacer 115 is a film having nano-contacts 116 disposed in a non-magnetic insulating matrix (e.g., a nano-contact is made of a magnetic grains in an insulating matrix). At least one of the grains reaches both surfaces of the free layer and the pinned layer. The nano-contact is one or more grains. Preferably, only a substantially few grains for each nano-contact is preferred.

The free layer 117 is provided above the spacer 115. As is the case in the related art, the magnetization direction of the free layer can rotate or switch in response to an external magnetic field. The magnetization direction is adjustable by the magnetic field. For example, but not by way of limitation, the external field may be generated from a medium such as a hard disk, and the pinned layer has a substantially fixed magnetization direction.

An in-stack bias 119 is positioned above the free layer 117 opposite to the spacer 115. The in-stack bias 119 includes an in-stack bias spacer 120 positioned between the free layer 117 and a ferromagnetic layer 123. The in-stack bias spacer 120 includes a second nano-contact 121 disposed in a non-magnetic insulating matrix 122.

Another AFM layer 125 is provided above the ferromagnetic layer 123 to substantially (i.e., except for external magnetization effects, such as "noise" from the device in which the present invention is applied) fix its magnetization direction and to form the upper portion of the in-stack bias 119. The magnetization direction of the ferromagnetic layer 123 is pinned by exchange coupling with the AFM layer 125. Atop shield 127 is provided above the in-stack bias 119, and an insulator 129 is provided between the top and bottom shields 101, 127, respectively, and on outside of the BMR sensor (103 through 125). A capping layer 126 is deposited on the top of the AFM layer 125 to protect the spin-valve stack against oxidation before top shield deposition.

In the foregoing exemplary, non-limiting embodiment of the present invention, the film structure of the in-stack bias 119 includes the in-stack bias spacer 120 which minimizes the exchange coupling between the free layer 117 and the ferromagnetic layer 123, thus stabilizing the free layer 117 in the mondomain structure by magnetostatic coupling with the ferromagnetic layer 123. Additionally, the current flows through the smaller space of the second nano-contacts 121, such that the effective area A is reduced, the ΔR is increased. Further, the MR ratio increases, resulting in additional ballistic magnetoresistive effect due to the creation of a domain wall within the magnetic nano-contact of the in-stack bias spacer 120.

As noted above, the pinned layer 107 can be a single ferromagnetic pinned layer or composed pinned layer. The composed pinned layer comprises the first pinned sublayer 109 and the second pinned sublayer 113. The magnetizations of these sublayers 109 and 113 are coupled antiferromagnetically to each other. The first and second pinned sublayers 109, 113 comprise a ferromagnetic material. A pinned layer spacer 111 is positioned between the layer 109 and the layer 113. The ferromagnetic material in the pinned layer 107 comprises one of Fe, Ni and Co. The pinned layer 107 has a total thickness between about 3 nm and 8 nm. The non-magnetic pinned layer spacer 111 is made of at least one of Ru, Rh, Pd, Pt, Ir, Os, Ag and Cu, or alloys thereof, and has a thickness between about 0.3 nm and 1 nm.

In the foregoing embodiment, the pinned layer 107 magnetization is disclosed to be pinned by the AFM layer 105. However, the present invention is not limited thereto, and alternative structures may be used, as would be understood by one of ordinary skill in the art. For example, but not by way of limitation, instead of being substantially fixed by the AFM layer 105, the pinned layer 107 may be self-pinned by a hard magnetic layer.

In the present invention, the sensing current flows in the film thickness direction (e.g., from the bottom shield to the top shield or the opposite direction). This is called Current-perpendicular-to-plane (CPP) geometry.

Figure 8:
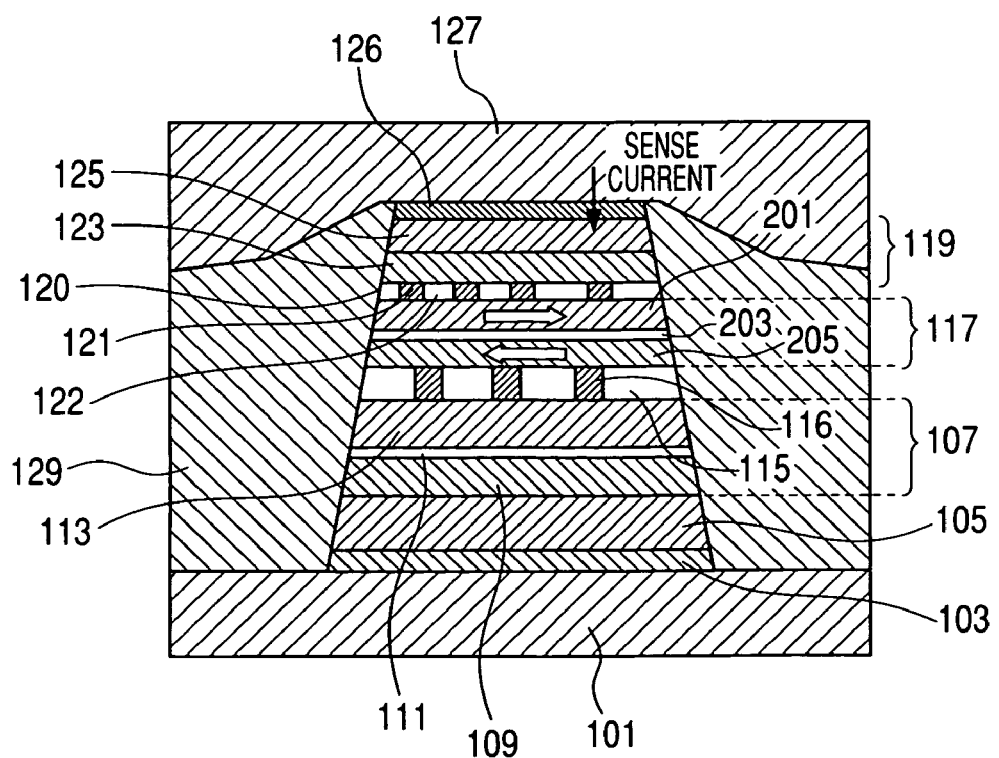
FIG. 8 illustrates magneto-resistive element according to a second exemplary, non-limiting embodiment of the present invention.

FIG. 8 illustrates a second, non-limiting embodiment of the present invention. In this embodiment, those features that are the same as the first embodiment of FIG. 7 are not repeated. In FIG. 8, the free layer 117 is a composed free layer, and includes a free layer spacer 203 positioned between an upper sublayer (first free sublayer) 201 and a lower sublayer (second free sublayer) 205 of the free layer 117. The free layer spacer 203 is made of at least one of Ru, Rh, Pd, Pt, Ir, Os, Ag and Cu, or alloys thereof, and has a thickness between about 0.3 nm and 1 nm. The two sublayers 201, 205 of the free layer 117 have a total thickness between about 1 nm and 5 nm.

Figure 9:
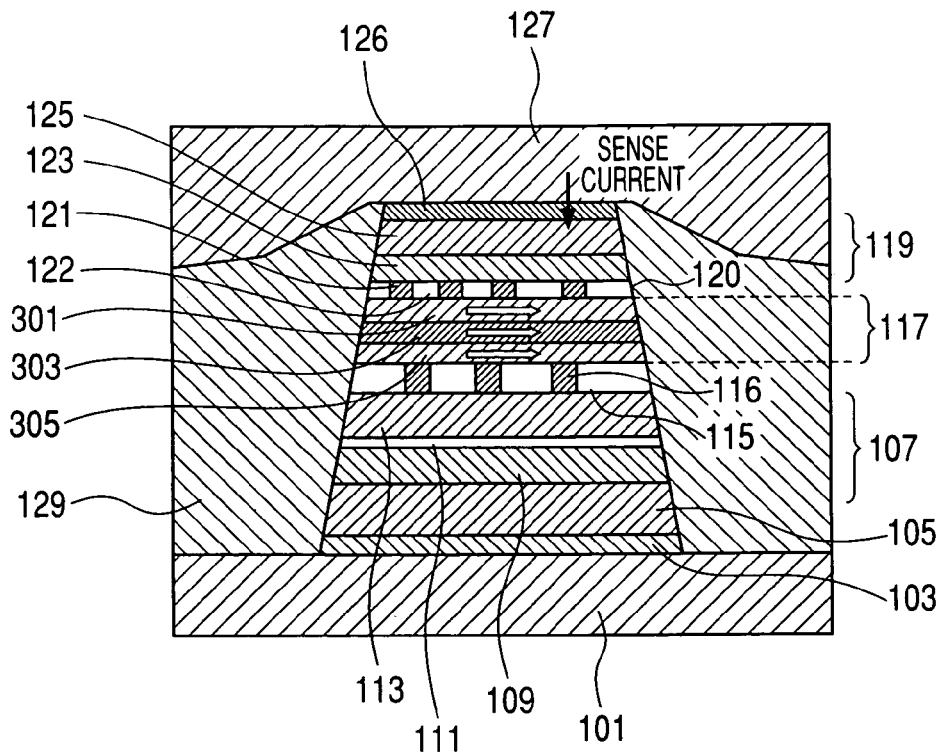
FIG. 9 illustrates magneto-resistive element according to a third exemplary, non-limiting embodiment of the present invention.

FIG. 9 illustrates a third, exemplary, non-limiting embodiment of the present invention. In this embodiment, those features that are the same as the first embodiment of FIG. 7 are not repeated. In FIG. 9, the free layer 117 is a composed free layer, and includes at least two, and preferably three, ferromagnetic sublayers 301, 303, 305 deposited on each other.

Figure 10:
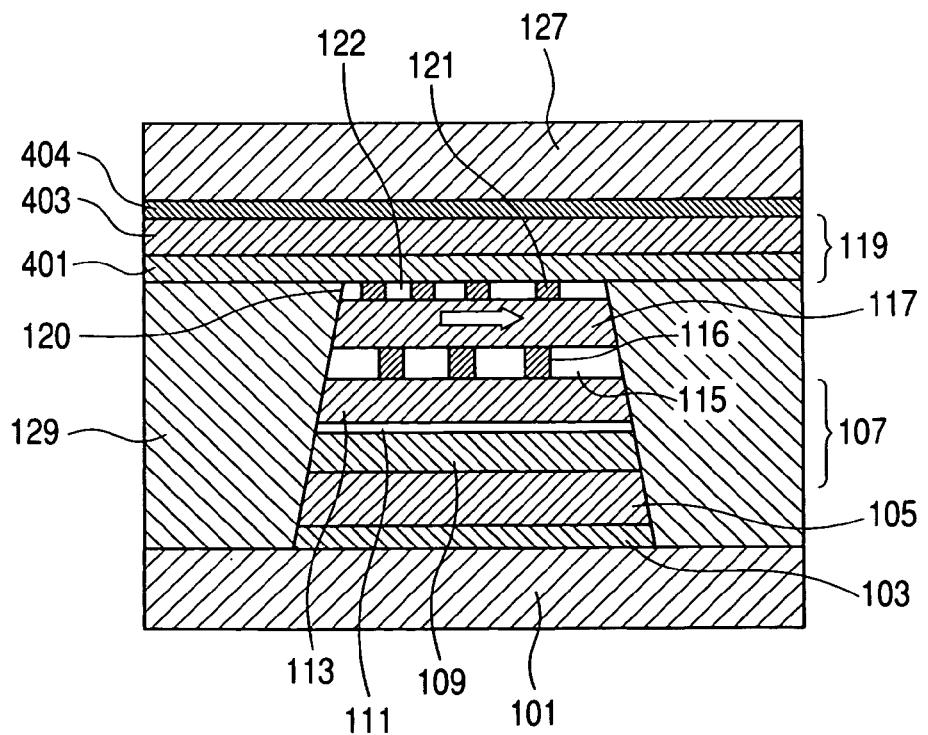
FIG. 10 illustrates magneto-resistive element according to a fourth exemplary, non-limiting embodiment of the present invention.

FIG. 10 illustrates a fourth, exemplary, non-limiting embodiment of the present invention. In this embodiment, those features that are the same as the first embodiment of FIG. 7 are not repeated. In FIG. 10, the ferromagnetic layer 401, the first AFM layer 403 and the capping layer 404 are deposited after patterning of the MR element and deposition of the insulator 129. As a result, those layers 401, 403 of the in-stack bias 119 are larger than the free layer 117. Thus, the in-stack bias 119 further stabilizes the free layer 117 at its edges (i.e., at the edge of the sensor). Because the in-stack bias 119 is larger than the free layer 117, and does not stop at the substantially same point as in the previous embodiments (i.e., the edges of the in-stack bias 119 extend beyond the edges of the free layer 117), this further stabilization can be achieved.

As the BMR sensor decreases in size and the chance of damage increases during lithography and ion milling if those steps are used, this embodiment avoids this edge effect. Further, as the vortex effect becomes dominant for a smaller size element, this exemplary embodiment substantially reduces the production of noise.

Figure 11:
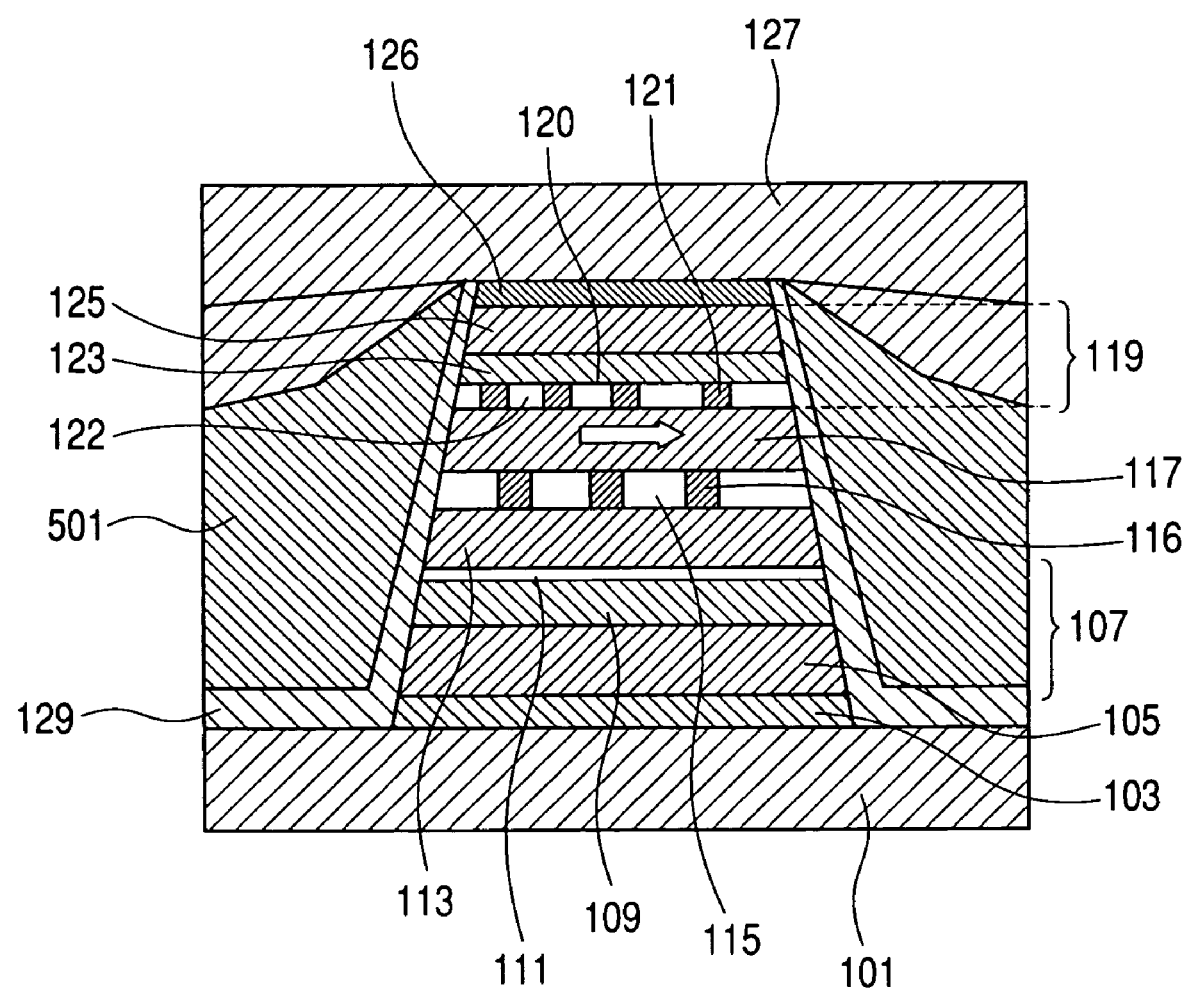
FIG. 11 illustrates magneto-resistive element according to a fifth exemplary, non-limiting embodiment of the present invention.

FIG. 11 illustrates a fifth, non-limiting exemplary embodiment of the present invention. In this embodiment, those features that are the same as the first embodiment of FIG. 7 are not repeated. In FIG. 11, an additional hard bias stabilizer 501 is provided on top of insulator 129. As a result, the free layer is further stabilized in an efficient manner. The hard bias stabilizer 501 is chosen from hard materials group including CoCr, CoPt and CoCrPt with a thickness from about 5 nm to 30 nm. This additional hard bias stabilizer 501 may also be used with the third and fourth embodiments as discussed above and illustrated in the drawings. The capping layer 126 is positioned above the first AFM 125.

For all of the above exemplary, non-limiting embodiments of the present invention, the ferromagnetic material in the free layer is of at least one of Ni, Fe, and Co. Alloys of CoNi, CoFe, NiFe, CoFeNi or any combination thereof is preferred. Further, either or both of the AFM layers 105, 125 is made of at least one of PtMn and IrMn, and has a thickness between about 5 nm and 20 nm. More generally, either or both of these AFM layers 105, 125 can be made of X—Mn or XY—Mn, where X and Y are made of Pt, Ir, Pd, Ru, Rh, Os, Fe and Ni, and X is different from Y. The capping layer 126 is made of at least one of Ta, Cr, Ru, Au and other non-magnetic materials and has a thickness of about 2 to 5 nm.

The first nano-contacts 116 and second nano-contacts 121 comprise at least one of Ni, Co and Fe, and have a diameter of less than about 10 nm. Further, the surrounding insulating matrix (insulator) in the spacer 120 includes at least one of oxides or nitrides such as $Al_2O_3$, AlN, $SiO_2$ and $Si_3N_4$. This material can also be a highly resistive, insulator having a resistivity higher than about 100 μΩ×cm. Alternatively, the nano-contact 116 may be surrounded by a non-magnetic, conductive matrix made of conductive material such as Cu, Au, Cr or equivalent thereof as the matrix.

With respect to the second nano-contact 121 in the in-stack bias layer 120, the surrounding insulator) 122 includes oxides and/or nitrides, or a high resistivity material of about 100 μΩ×cm or higher. The second nano-contact 121 can also be surrounded by a non-magnetic conductive material.

Further, in FIGS. 8-11, the direction of magnetization of the in-stack bias 123 (not illustrated for the sake of clarity) is opposite to the direction of the free layer 117. However, the present invention is not limited thereto, and other configurations as may be envisioned by one of ordinary skill in the art may also be used.

The present invention has various advantages. For example, but not by way of limitation, the present invention includes a BMR sensor having a free layer stabilized by in-stack bias and an in-stack bias spacer having a nano-contact. As a result, the stability of the free layer is maintained and the effective area of the MR element is reduced due to the confined current path, which results in a higher output read signal.

Additionally, a domain wall is created between the free layer and the ferromagnetic pinned layer used in the stabilizer. Thus, there is an improvement in the MR ratio and resistance change.

Further, in the present invention, a method is provided for preparing the free layer having grains disposed in a matrix made by ion beam sputtering method using a target having at least magnetic material and insulator (e.g. magnetic material like Ni and insulator like $Al_2O_3$. Ni grows as grains surrounded by $Al_2O_3$). The surface is etched to ensure that those grains reach the surface to form the nano-contact.

Additionally, the foregoing embodiments are generally directed to a magnetoresistive element for a magnetoresistive read head. This magnetoresistive read head can optionally be used in any of a number of devices. For example, but not by way of limitation, as discussed above, the read head can be included in a hard disk drive (HDD) magnetic recording device. However, the present invention is not limited thereto, and other devices that uses the ballistic magnetoresistive effect may also comprise the magnetoresistive element of the present invention. For example, but not by way of limitation, a magnetic random access memory (i.e., a magnetic memory device provided with a nano-contact structure, or a device) may also employ the present invention. Such applications of the present invention are within the scope of the present invention.

The present invention is not limited to the specific above-described embodiments. It is contemplated that numerous modifications may be made to the present invention without departing from the spirit and scope of the invention as defined in the following claims.

We claim:

1. A magnetic element comprising:
   a free layer having a magnetization direction that is adjustable in response to an external magnetic field;
   a pinned layer having a substantially fixed magnetization direction;
   a spacer sandwiched between said pinned layer and said free layer, said spacer comprising a first nano-contact disposed in a first insulating matrix; and
   an in-stack bias positioned above said free layer opposite said spacer, wherein said in-stack bias comprises a ferromagnetic layer having a pinned magnetization direction that is pinned by exchange coupling with a first antiferromagnetic (AFM) layer, and an in-stack bias spacer including a second nano-contact disposed in a second insulating matrix.

2. The magnetic element according to claim 1, wherein said pinned layer is one of a ferromagnetic single layer and a composed pinned layer, said composed pinned layer having a pinned layer spacer positioned between a first pinned sublayer and a second pinned sublayer having antiferromagnetically coupled magnetization directions.

3. The magnetic element according to claim 1, wherein said substantially fixed magnetization direction of said pinned layer is substantially fixed by one of a second antiferromagnetic layer and a hard magnetic layer.

4. The magnetic element according to claim 1, wherein said free layer is one of a single ferromagnetic free layer and a composed free layer, said composed free layer having a free layer spacer positioned between a first free sublayer and a second free sub layer having an antiferromagnetically coupled magnetization direction.

5. The magnetic element according to claim 4, wherein a thickness of said first -free sublayer and said second free sublayer is between about 1 nm and 5 nm.

6. The magnetic element of claim 1, wherein said free layer comprises at least two sublayers made of different materials and have ferromagnetically coupled magnetizations.

7. The magnetic element of claim 1, wherein said ferromagnetic layer and said first AFM extend beyond the edges of said free layer, and said ferromagnetic layer and said first AFM are larger than said free layer.

8. The magnetic element of claim 1, further comprising a hard bias stabilizer positioned on an insulator formed on sides of said free layer, said pinned layer, said spacer and said in-stack bias.

9. The magnetic element of claim 8, wherein said hard bias comprises a hard material with a thickness between about 5 nm and 30 nm.

10. The magnetic element of claim 1, wherein said free layer and said pinned layer each comprise at least one of Co, Ni, and Fe.

11. The magnetic element of claim 1, wherein said first AFM layer has a thickness between about 5 nm and 20 nm.

12. The magnetic element of claim 1, wherein said first AFM layer comprises one of X-Mn and XY-Mn, wherein said X and said Y each comprise one of Pt, Ir, Pd, Ru, Rh, Os, Fe and Ni, and said X is different from said Y.

13. The magnetic element of claim 1, wherein at least one of said first nano-contacts and said second nano-contacts comprise at least one of Ni, Co and Fe and have a diameter of less than about 10 nm.

14. The magnetic element of claim 1, wherein said insulating matrix comprises one of an oxide and a nitride.

15. The magnetic element of claim 14, wherein one of said oxide and said nitride comprise one of $Al_2O_3$, $SiO_2 Si_3N_4$, and AlN.

16. The magnetic element of claim 1, wherein said first nano-contact is surrounded by a highly resistive, non magnetic material having a resistivity greater than about 100 $\mu\Omega \times cm$.

17. The magnetic element of claim 1, wherein said second nano-contact is surrounded by a highly resistive, insulator having a resistivity greater than 100 $\mu\Omega \times cm$.

18. The magnetic element of claim 1, wherein a sensing current flows through said magnetic element in a current-perpendicular to plane configuration.

19. A magnetic element comprising:
   a free layer having a magnetization direction adjustable in response to an external magnetic field;
   a pinned layer having a substantially fixed magnetization direction;
   a spacer sandwiched between said pinned layer and said free layer, said spacer comprising a first nano-contact disposed in a conductive matrix; and
   an in-stack bias positioned on said free layer opposite said spacer, wherein said in-stack bias comprises a ferromagnetic layer having a pinned magnetization direction that is pinned by exchange coupling with a first antiferromagnetic (AFM) layer, and an in-stack bias spacer including a second nano-contact disposed in a non-magnetic matrix.

20. The magnetic element of claim 19, wherein conductive matrix comprises at least one of Cu, Ag, Au, Ta, Ru, Rh and Cr.

21. A device comprising:
   a free layer having a magnetization direction that is adjustable in response to an external magnetic field;
   a pinned layer having a substantially fixed magnetization direction;
   a spacer sandwiched between said pinned layer and said free layer, said spacer comprising a first nano-contact disposed in a first insulating matrix; and
   an in-stack bias positioned above said free layer opposite said spacer, wherein said in-stack bias comprises a ferromagnetic layer having a pinned magnetization direction that is pinned by exchange coupling with a first antiferromagnetic (AFM) layer, and an in-stack bias spacer including a second nano-contact disposed in a second insulating matrix.

* * * * *